United States Patent

Mallory

Patent Number: 5,786,698
Date of Patent: Jul. 28, 1998

[54] TRANSDUCER BOOTSTRAPPING APPARATUS

[75] Inventor: Roy E. Mallory, Bedford, Mass.

[73] Assignee: ADE Corporation, Newton, Mass.

[21] Appl. No.: 612,134

[22] Filed: Mar. 7, 1996

[51] Int. Cl.[6] ............................................. H03F 3/30
[52] U.S. Cl. ........................... 324/611; 324/661; 330/297
[58] Field of Search ............................ 330/297; 324/661, 324/662, 611

[56] References Cited

U.S. PATENT DOCUMENTS

| | | | |
|---|---|---|---|
| 3,453,554 | 7/1969 | Shoemaker | 330/297 |
| 3,521,179 | 7/1970 | Blancke | 330/297 |
| 3,530,396 | 9/1970 | Rudolph | 330/297 |
| 4,092,701 | 5/1978 | Bumgardner | 330/297 |
| 4,190,797 | 2/1980 | Lecklider et al. | |
| 4,337,441 | 6/1982 | Kellogg | 330/297 |
| 4,387,601 | 6/1983 | Azegami | |
| 4,459,541 | 7/1984 | Fielden et al. | |
| 4,584,885 | 4/1986 | Cadwell | |
| 4,636,714 | 1/1987 | Allen | |
| 4,683,754 | 8/1987 | Hirata et al. | |
| 5,028,876 | 7/1991 | Cadwell | |
| 5,148,126 | 9/1992 | Spencer | |
| 5,216,382 | 6/1993 | Ito | 330/297 |
| 5,326,982 | 7/1994 | Wiklund | |
| 5,343,157 | 8/1994 | Deschamps | |
| 5,343,766 | 9/1994 | Lee | |

Primary Examiner—Ernest F. Karlsen
Assistant Examiner—Jose M. Solis
Attorney, Agent, or Firm—Weingarten, Schurgin, Gagnebin & Hayes LLP

[57] ABSTRACT

An apparatus for bootstrapping an amplifier of a capacitive displacement transducer. The apparatus replaces a transformer with two capacitors and two resistors configured to provide biased supply voltages to the positive and negative power supply connections of an amplifier configured as a high impedance unity gain buffer in the transducer. The replacement of the transformer with a pair of standard capacitors and resistors provides for similar performance at a reduced size and cost.

6 Claims, 1 Drawing Sheet

TRANSDUCER BOOTSTRAPPING APPARATUS

FIELD OF THE INVENTION

The invention relates generally to transducers and more particularly to capacitive displacement sensors implementing transducers.

BACKGROUND OF THE INVENTION

Capacitive displacement transducers are known in the art. A typical capacitive displacement transducer comprises a capacitive probe which includes two plates of a three plate capacitor. The third plate of the three plate capacitor is the surface of the object being measured which is typically grounded. The capacitive probe is brought into proximity with the surface of the object being measured. The air between the probe and the surface of the object being measured serves as the dielectric of the three plate capacitor. The sensor further includes an amplifier configured as a unity gain buffer. In such a configuration, the amplifier needs to be powered from a driven supply.

Typically, the probe capacitance of a capacitive displacement sensor is in the tenth of picoFarads (pF) range and the input impedance of the amplifier must be extremely high. An input resistance on the order of one gigohm (GΩ) is appropriate. The amplifier must also have a gain extremely close to unity. A gain of 0.9999 is appropriate.

In order to obtain the objectives of high input impedance and accurate unity gain, the amplifier has its power supply connections "bootstrapped" to its output through a transformer. In such a setup the output of the amplifier of the sensor is provided to a second amplifier which drives the primary of a transformer. The transformer includes two secondaries. A first secondary of the transformer is connected between the positive power supply and the positive power connection of the amplifier. Likewise, the other secondary is connected between the negative power supply and the negative power connection of the amplifier. In this manner the output voltage from the second amplifier is superimposed on the power supply connections.

The drawbacks associated with such a configuration are that the required transformer is large, expensive, is susceptible to stray electric and magnetic fields. To achieve the desired functions, it may need to be custom made.

SUMMARY OF THE INVENTION

A transducer bootstrapping circuit is disclosed. The output voltage of the transducer is superimposed onto the power connections of an amplifier of the transducer. A transformer of prior art configurations is replaced with a pair of standard, off-the-shelf resistors and capacitors. The performance of the circuit is maintained, but at a smaller size and lower cost. In such a manner the amplifier used in the transducer has a high input impedance, and can maintain a gain extremely close to unity.

BRIEF DESCRIPTION OF THE DRAWINGS

The invention will be more fully understood from the following detailed description taken in conjunction with the accompanying drawings in which.

DETAILED DESCRIPTION

Figure 1:
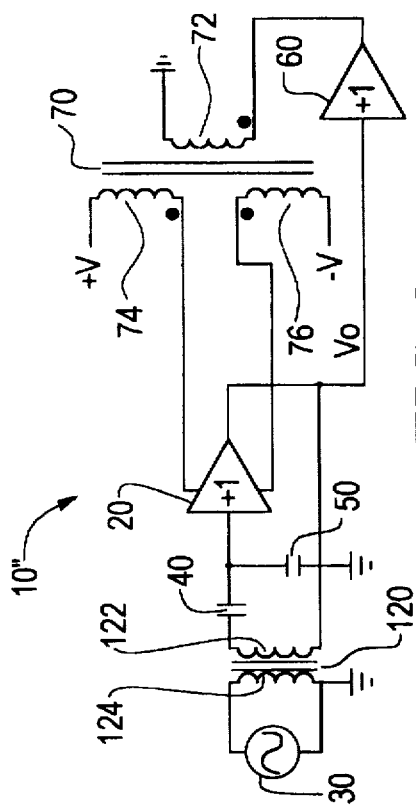
FIG. 1 is a schematic diagram of a prior art capacitive displacement sensor having a bootstrapped buffer.

FIG. 1 shows a prior art capacitive displacement sensor 10. The sensor 10 comprises an excitation signal source 30 which provides a sinusoidal excitation signal which is coupled through reference capacitor 40 to the input of a first buffer 20. Buffer 20 is an amplifier, such as an operational amplifier, configured as a unity gain buffer. The excitation signal, which in the present embodiment is sinusoidal, is also capacitively coupled to one plate of probe capacitor 50. The other plate of probe capacitor 50 is the surface of the object being measured, which is typically grounded. The output of the first buffer 20 is a linear function of the distance between the plate of probe capacitor 50 and the surface being measured. The output of buffer 20 is in phase with the excitation signal provided by excitation signal source 30. The relationship between the measurement voltage and the object distance is linear, and changes in the measured voltage correlate to changes in the distance between the plates of probe capacitor 50 and the surface of the object being measured. Due to the configuration of the amplifier as a high impedance, accurate unity gain buffer, the power supplied to the first buffer 20 is driven. The buffer must also have a gain extraordinarily close to unity, typically a gain of 0.9999 is appropriate.

One manner of achieving the accurate unity gain and a high input impedance required by the circuit is to "bootstrap" the power supply connections of the amplifier 20. "Bootstrapping" is done by taking the output signal $V_o$ provided by the amplifier and applying it to a second buffer 60. Second buffer 60 then provides an output to one end of the primary 72 of a transformer 70. The other end of primary 72 is grounded. Transformer 70 includes secondaries 74 and 76. Secondary 74 has one end of its windings connected to a positive supply rail +V, and the other end of its winding to the positive power connection of amplifier 20. Secondary 76 of transformer 70 has one end of its windings connected to the negative supply rail −V, and the other end of its windings connected to the negative power connection of the amplifier 20. With such a configuration, the output of amplifier 20 is superimposed onto the supply voltages through second buffer 60 and transformer 70, resulting in an increased input impedance of the amplifier, a decrease in the input capacitance at the amplifier, and a gain that is very close to unity.

Figure 2:
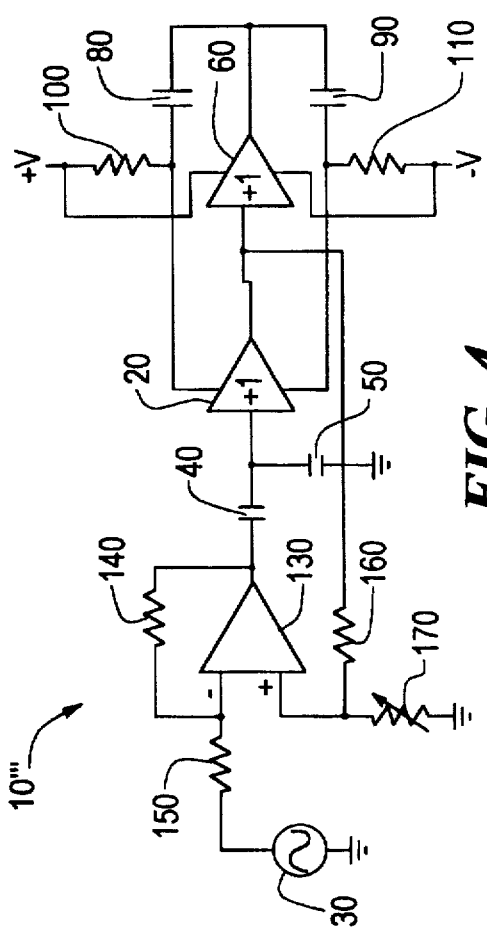
FIG. 2 is a schematic diagram of a capacitive displacement sensor including a bootstrapping configuration of the present invention.

FIG. 2 discloses a capacitive displacement transducer incorporating the present invention. The transformer 70 of FIG. 1, and its associated bulk and cost, have been replaced with four discrete components. The output of second buffer 60 is connected to a first lead of two capacitors, a first capacitor 80 connected in series between the output of the second buffer 60 and the positive power connection of amplifier 20, and a second capacitor 90 connected in series between the output of buffer 60 and the negative power connection of amplifier 20. A first resistor 100 is connected in series between the positive voltage supply rail +V and the positive power connection of the amplifier 20. A second resistor 110 is connected in series between the negative power supply rail −V and the negative power connection of the amplifier 20. The circuit of FIG. 2 functions to the same advantage as the circuit of FIG. 1, but at a reduced size and cost.

The resistance value of resistors 100 and 110 is chosen such that the value is large enough so that the second amplifier 60 can drive the circuit, while still being small enough to effect buffer 20. In a particular embodiment, the resistors are standard ¼ watt 1.5K ohm resistors, and the capacitors have a value of 10 μFarads.

Figure 3:
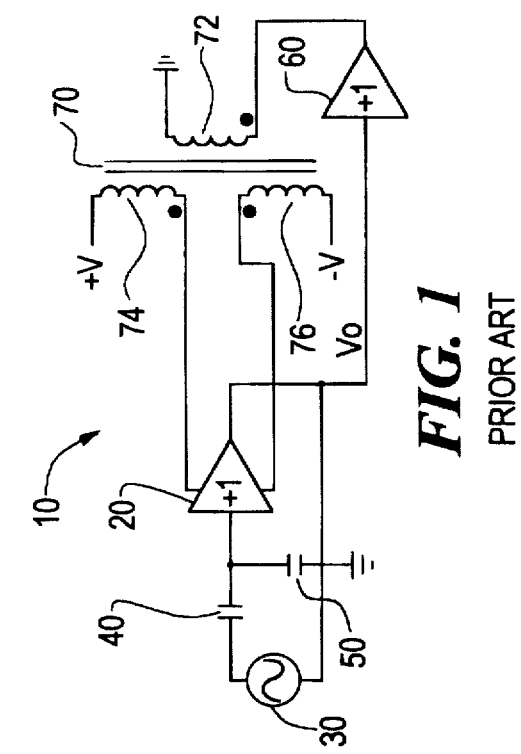
FIG. 3 is a schematic diagram of a prior art capacitive displacement sensor including an input transformer.

FIG. 3 shows a prior art capacitive displacement sensor 10" which has the input excitation signal referenced to $V_o$. In order to provide this configuration an input isolation transformer 120 has been inserted into the circuit. The excitation signal source 30 is coupled across primary 124 of isolation transformer 120. The secondary 122 of the transformer 120 has one end connected to the reference capacitor 40 and the other end connected to the output $V_o$ of the amplifier 20. With such a configuration the excitation signal is referenced to the output of amplifier 20.

Figure 4:
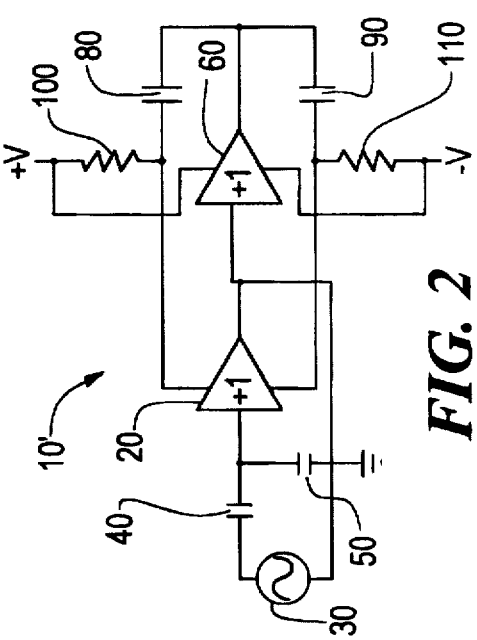
FIG. 4 is a schematic diagram of an improved capacitive displacement sensor incorporating the present invention.

FIG. 4 is a schematic circuit showing the circuit of FIG. 3 where the isolation transformer has been replaced with a circuit that improves the linearity of the sensor, as recited in U.S. Pat. No. 4,918,376 to Poduje et al. Combining the teaching of Pat. No. 4,918,376 with the present invention transforms the prior art circuit of FIG. 3 to the circuit of FIG. 4. The isolation transformer 120 has been replaced by an amplifier 130, three resistors 140, 150 and 160, and a variable resistor 170, while transformer 70 has been replaced with two resistors 100 and 110, and two capacitors 80 and 90. Accordingly, the circuit of FIG. 4 provides for a smaller, higher quality, lower cost capacitive displacement transducer.

Having described preferred embodiments of the invention it will now become apparent to those of ordinary skill in the art that other embodiments incorporating these concepts may be used. Accordingly, it is submitted that the invention should not be limited to the described embodiments but rather should be limited only by the spirit and scope of the appended claims.

I claim:

1. A capacitive displacement sensor comprising:

an excitation signal source;

an amplifier configured as a buffer;

a reference capacitor coupled between one end of said excitation signal source and an input of said amplifier;

a probe capacitor connected between said input of said amplifier and ground;

a second buffer having an input connected to the output of said amplifier and the other end of said excitation signal source;

a first capacitor connected in series between the output of said second buffer and a negative power connection of said amplifier;

a second capacitor connected in series between the output of said second buffer and a positive power connection of said amplifier;

a first resistor connected in series between a positive supply voltage and a positive power connection of said amplifier; and a second resistor connected in series between a negative supply voltage and a negative power connection of said amplifier.

2. The apparatus of claim 1 wherein said first and second resistors have resistance values of approximately 1.5K ohms each.

3. The apparatus of claim 1 wherein said first and second capacitors have capacitance values of approximately 10 μF each.

4. A capacitive displacement sensor comprising:

an excitation signal source having one end connected to ground;

an amplifier configured as a buffer;

a reference capacitor, having one end connected to an input of said amplifier;

a probe capacitor connected between said input of said amplifier and ground;

a second buffer having an input connected to the output of said amplifier;

a first capacitor connected in series between the output of said second buffer and a negative power connection of said amplifier;

a second capacitor connected in series between the output of said second buffer and a positive power connection of said amplifier;

a first resistor connected in series between a positive supply voltage and a positive power connection of said amplifier;

a second resistor connected in series between a negative supply voltage and a negative power connection of said amplifier;

a third amplifier having an output connected to a second end of said reference capacitor;

a third resistor connected in series between said excitation signal and an inverting input of said third amplifier;

a fourth resistor connected between said output of said amplifier and said inverting input of said amplifier;

a fifth resistor connected between said output of said first amplifier and a non-inverting input of said third amplifier; and a variable resistor connected between said non-inverting input of said amplifier and ground.

5. The apparatus of claim 4 wherein said first and second resistors have resistance values of approximately 1.5K ohms each.

6. The apparatus of claim 4 wherein said first and second capacitors have capacitance values of approximately 10 μF each.

* * * * *